(12) United States Patent
Goldbach et al.

(10) Patent No.: US 6,477,025 B1
(45) Date of Patent: Nov. 5, 2002

(54) SURGE PROTECTION DEVICE WITH THERMAL PROTECTION, CURRENT LIMITING, AND FAILURE INDICATION

(75) Inventors: William Goldbach, Spring Hill, FL (US); Ronald Hotchkiss, Brooksville, FL (US)

(73) Assignee: Innovative Technology, Inc., Brooksville, FL (US)

( * ) Notice: Subject to any disclaimer, the term of this patent is extended or adjusted under 35 U.S.C. 154(b) by 0 days.

(21) Appl. No.: 09/415,967

(22) Filed: Oct. 12, 1999

(51) Int. Cl.$^7$ .............................. H02H 5/04; H02H 3/20; H01H 37/76
(52) U.S. Cl. ...................... 361/103; 361/56; 337/159; 338/21
(58) Field of Search ..................... 361/56, 111, 127, 361/103; 337/14, 290, 159; 338/21

(56) References Cited

U.S. PATENT DOCUMENTS

| | | | | |
|---|---|---|---|---|
| 4,023,071 A | * | 5/1977 | Fussell | 361/56 |
| 4,123,738 A | * | 10/1978 | Huber | 337/159 |
| 4,152,743 A | * | 5/1979 | Comstock | 361/56 |
| 4,271,446 A | | 6/1981 | Comstock | |
| 4,723,117 A | * | 2/1988 | Griffiths | 337/186 |
| 4,907,119 A | | 3/1990 | Allina | |
| 5,032,946 A | * | 7/1991 | Misencik et al. | 361/56 |
| 5,099,218 A | * | 3/1992 | Salisbury | 337/296 |
| 5,412,526 A | | 5/1995 | Kapp et al. | |
| 5,488,534 A | | 1/1996 | Rau et al. | |
| 5,714,923 A | * | 2/1998 | Shea et al. | 337/159 |
| 5,757,603 A | | 5/1998 | Kapp et al. | |
| 5,760,673 A | * | 6/1998 | Hassler et al. | 337/168 |
| 5,790,360 A | | 8/1998 | Ryan | |
| 5,886,613 A | * | 3/1999 | Magoon et al. | 337/244 |
| 5,905,622 A | | 5/1999 | Finlay, Sr. et al. | |
| 5,914,662 A | * | 6/1999 | Burleigh | 340/635 |
| 5,986,870 A | * | 11/1999 | Kapp | 361/127 |
| 6,055,147 A | * | 4/2000 | Jeffries et al. | 361/103 |
| 6,282,073 B1 | * | 8/2001 | Glaser | 361/104 |

OTHER PUBLICATIONS

Ed. D.G. Fink, J.M. Carroll. Standard Handbook for Electrical Engineers. McGraw–Hill. Co. 10th edition.*

* cited by examiner

Primary Examiner—Stephen W. Jackson
Assistant Examiner—Z. Kitov
(74) Attorney, Agent, or Firm—Taylor Russell & Russell, P.C.

(57) ABSTRACT

The disclosure describes a surge protection device that makes use of metal oxide varistors (MOVs) to limit the magnitude of electrical surges in single phase or multi-phase power distribution networks. Since MOVs generally fail in a low impedance mode when the electrical ratings of the devices are exceeded, current limiting and thermal limiting devices are connected in series with the MOVs to limit the effect of these failures to the surge protection devices. The physical configuration of the surge protection device limits the effects of a current limiter being activated by providing a barrier between the current limiter and the associated MOV. Filler material is also used to limit the effects of debris or plasma gas from an activated current limiter. Multiple surge protection devices may be connected in parallel to provide increased current handling capability, and visual indication of a failed surge protection device may be provided.

34 Claims, 8 Drawing Sheets

SURGE PROTECTION DEVICE WITH THERMAL PROTECTION, CURRENT LIMITING, AND FAILURE INDICATION

BACKGROUND

The invention relates generally to electrical surge protection devices and, more particularly, to electrical surge protection devices that make use of metal oxide varistors (MOVs), thermal protection elements and current limiting elements.

Electrical surges occur in single phase or multi-phase power distribution networks, and may be induced be near-by electromagnetic radiation such as lightning discharges. Electrical surges may also result from equipment connected to the power distribution network being turned on or off. Certain electrical equipment may generate electrical surges in a power distribution network in the course of normal operation. Typical surge generating equipment includes motors, lights, and welding equipment. Generally, larger load currents create greater electrical surges when switched on or off. While circuit breakers protect against excess current conditions, surge protection devices (SPDs) protect against excess voltage conditions. These devices may be located at a service entrance to prevent electrical surges from penetrating a local power distribution network, such as a building or a complex of buildings. They may also be located at a source of electrical surges to prevent distribution of the surges, or at sensitive electrical equipment to prevent electrical surges from entering and damaging this equipment. SPDs are generally connected between the phases of a power distribution system and a neutral and ground potential, but other configurations are sometimes used. Multiple SPDs are often connected in parallel to increase current-handling capability. A means for indicating a failure of one or more SPDs is often associated with these devices.

Metal oxide varistors (MOVs) are commonly used in combination with current limiting fuse elements in SPDs. MOVs are two-terminal electrical devices that have a non-linear voltage-current relationship. At low voltages, a MOV exhibits a high impedance between its two terminals, but at voltages higher than a predetermined limit voltage the impedance rapidly changes to a low impedance. This characteristic is useful as a voltage limiter, because as the voltage across the MOV terminals increases, within the power handling capability of the MOV, the voltage is clamped to the predetermined limit voltage. The predetermined limit voltage is a characteristic dependent on a particular MOV, and is determined by the MOV manufacturing process.

An overload condition occurs in an SPD if a sustained current, a high current surge pulse, or multiple repetitive surge pulses, having a voltage sufficiently higher than the predetermined limit voltage to cause conduction, flows through a MOV causing the power capability of the MOV to be exceeded. A sustained overload condition will normally cause the MOV to fail in a short-circuit condition. Without protection, the MOV would become over-heated, cause the circuit to be overloaded, and trip a circuit breaker. This could lead to disintegration of the MOV and other components nearby. To prevent this overload condition, a fuse is normally connected in series with the MOV to limit the maximum current through the MOV. Thus, upon a high current overload condition causing a MOV failure, the series fuse opens to prevent a circuit breaker from tripping, but the surge protection capability is lost. However, it is possible, particularly with repetitive multiple surges pulses, to generate excessive heat in the MOV without causing the series fuse to open. This excessive heat could cause damage to other components that could lead to a chain reaction of failures. Some form of thermal protection is required to prevent these types of failures. To alert maintenance personnel of the failure, many SPDs incorporate visual or audio indication of the failure. In order to increase the power and current-handling capability of an assembly that incorporates SPDs, multiple SPDs are often connected in a parallel configuration.

Upon a failure of a MOV or its associated series fuse due to an overload condition, the MOV or fuse may disintegrate, causing electrically conductive debris to be dispersed in the vicinity of the MOV or fuse. This debris may cause short-circuits in any electronic circuitry in the vicinity of the MOV or fuse, including other SPD circuits or a failure indication mechanism. Another possibility is that the destruction of a MOV or fuse, due to an overload condition, may vaporize and create an ionized gas or plasma containing metallic particles. This plasma is a conductive gas and is very invasive. It may also cause short-circuits in electrical and electronic circuits that it comes in contact with. A plasma of this nature could short-circuit a power distribution system and has a potential capability of causing extensive damage and bodily harm to nearby personnel.

Therefore, there is a need for a compact SPD for use in power distribution systems that is capable of limiting the voltage amplitude of a surge pulse, will open-circuit if a predetermined current limit is exceeded, will open-circuit if the MOV power dissipation creates a temperature that exceeds a predetermined thermal threshold, and will provide a means whereby any conductive debris or plasma gas is contained within a confined region where further damage cannot be propagated. There is also a need to configure multiple SPDs in parallel in order to increase current handling capability. Visual display of a failed SPD is also needed so that maintenance personnel will be alerted to a failed condition.

SUMMARY

The present invention is directed to a compact device that satisfies these needs. The present invention provides a compact means for limiting the voltage amplitude of a surge pulse through the use of a MOV. A series fuse element is provided that limits the maximum current through the MOV. A series thermal limiting element is also provided that limits the maximum temperature in the vicinity of the MOV. Suitable barriers and filler materials are provided to limit the extent of debris or plasma gas. Multiple SPDs may be configured in a parallel configuration and visual indication of a failed SPD may be provided.

A device having features of the present invention is a surge protection device for a power distribution network that comprises a current limiter connected between a first input terminal and a bridge terminal, the first input terminal connecting to the power distribution network, a thermal protector connected between the bridge terminal and a central terminal, a metal oxide varistor connected between the central terminal and a second input terminal, the second input terminal connecting to the power distribution network, a current sense resistor connected between the bridge terminal and the central terminal, and a thermal sense resistor connected between the central terminal and an indicator terminal. The current limiter may comprise a perforated silver ribbon, a strand of silver wire, multiple strands of silver wire, a silver ribbon, a copper ribbon, or a perforated copper ribbon. The current limiter may be enclosed in a fuse tube. The thermal protector may comprise a device selected from the group consisting of a low melting point alloy wire, a lead-indium alloy wire, a lead-antimony alloy wire, and a thermal cutout device. The thermal protector may be positioned in close proximity with the metal oxide varistor. The current sense resistor may be replaced by a current sense capacitor and the thermal sense resistor may be replaced by a thermal sense capacitor. A bridge may be positioned between the current limiter and the metal oxide varistor for providing an isolating barrier. The device may include a housing for containing the surge protection device, sand for filling void spaces within the housing, and potting material for sealing the housing. A failure indicator circuit may be connected to the indicator terminal. The configuration of the current sense resistor and the thermal sense resistor supplies a signal at the indicator terminal that provides a distinction between a thermal protector open circuit and a current limiter open circuit. The failure indicator circuit may comprise a summing resistor connected between the indicator terminal and a ground, a rectifier having an anode connected to the indicator terminal and a cathode connected to a comparator circuit first input terminal, a capacitor and resistor parallel circuit connected between the rectifier cathode and the ground, a zener diode having a cathode connected to the rectifier anode and an anode connected to ground, a comparator circuit second input terminal connected to ground, and a comparator circuit output connected to a visual indicator. The comparator may be replaced by a microprocessor. Multiple surge protection devices may be connected to a multi-phase power distribution system.

In an alternate embodiment of the invention, a surge protection circuit for a power distribution network comprises a plurality of identical circuits, each circuit comprising a current limiter connected between a first input terminal and a bridge terminal, a thermal protector connected between the bridge terminal and a central terminal, a metal oxide varistor connected between the central terminal and a second input terminal, a current sense resistor connected between the bridge terminal and the central terminal, and a thermal sense resistor connected between the central terminal and an indicator terminal, wherein the first input terminals of each identical circuit are connected together and connect to the power distribution network, the second input terminals of each identical circuit are connected together and connect to the power distribution network, and the indicators terminals are connected together. Each current limiter may comprise a perforated silver ribbon, a strand of silver wire, multiple strands of silver wire, a silver ribbon, a copper ribbon, or a perforated copper ribbon. Each current limiter may be enclosed in a fuse tube. Each thermal protector may comprises a device selected from the group consisting of a low melting point alloy wire, a lead-indium alloy wire, a lead-antimony alloy wire, and a thermal cutout device. Each thermal protector may be positioned in close proximity with the metal oxide varistor in the same circuit. Each current sense resistor may be replaced by a current sense capacitor and each thermal sense resistor may be replaced by a thermal sense capacitor. A bridge may be positioned between each current limiter and each metal oxide varistor for providing an isolating barrier. The invention may further comprise a housing for containing the surge protection device, sand for filling void spaces within the housing, and potting material for sealing the housing. A failure indicator circuit may be connected to the indicator terminal. The configuration of the current sense resistors and the thermal sense resistors supplies a signal at the indicator terminal that provides a distinction between thermal protector open circuits and current limiter open circuits. The failure indicator circuit may comprise a failure detection circuit, a comparator, and a visual indicator. The comparator may be replaced by a microprocessor. Multiple surge protection devices may be connected to a multi-phase power distribution system.

Another embodiment of the present invention is a method of fabricating a surge protection device for a power distribution network, comprising connecting a current limiter between a first input terminal and a bridge terminal, the first input terminal being connected to the power distribution network, connecting a current limiter between a first input terminal and a bridge terminal, the first input terminal being connected to the power distribution network, connecting a thermal protector between the bridge terminal and a central terminal, connecting a metal oxide varistor between the central terminal and a second input terminal, the second input terminal being connected to the power distribution network, connecting a current sense resistor between the bridge terminal and the central terminal, and connecting a thermal sense resistor between the central terminal and an indicator terminal. The current limiter may comprise a perforated silver ribbon enclosed within a fuse tube. The thermal protector may be positioned in close proximity with the metal oxide varistor. A bridge may be positioned between the current limiter and the metal oxide varistor for providing an isolating barrier. The embodiment may further comprise positioning the connected circuit components within a housing, filling the housing with sand, and sealing the housing with potting material. The method may further comprise connecting a failure indicator circuit to the indicator terminal. The current sense resistor may be replaced by a current sense capacitor and the thermal sense resistor may be replaced by a thermal sense capacitor.

BRIEF DESCRIPTION OF THE DRAWINGS

These and other features, aspects and adbantages of the present invention will become better understood with regard to the following description, appended claim, and accompanying drawings where:

DETAILED DESCRIPTION

Figure 1:
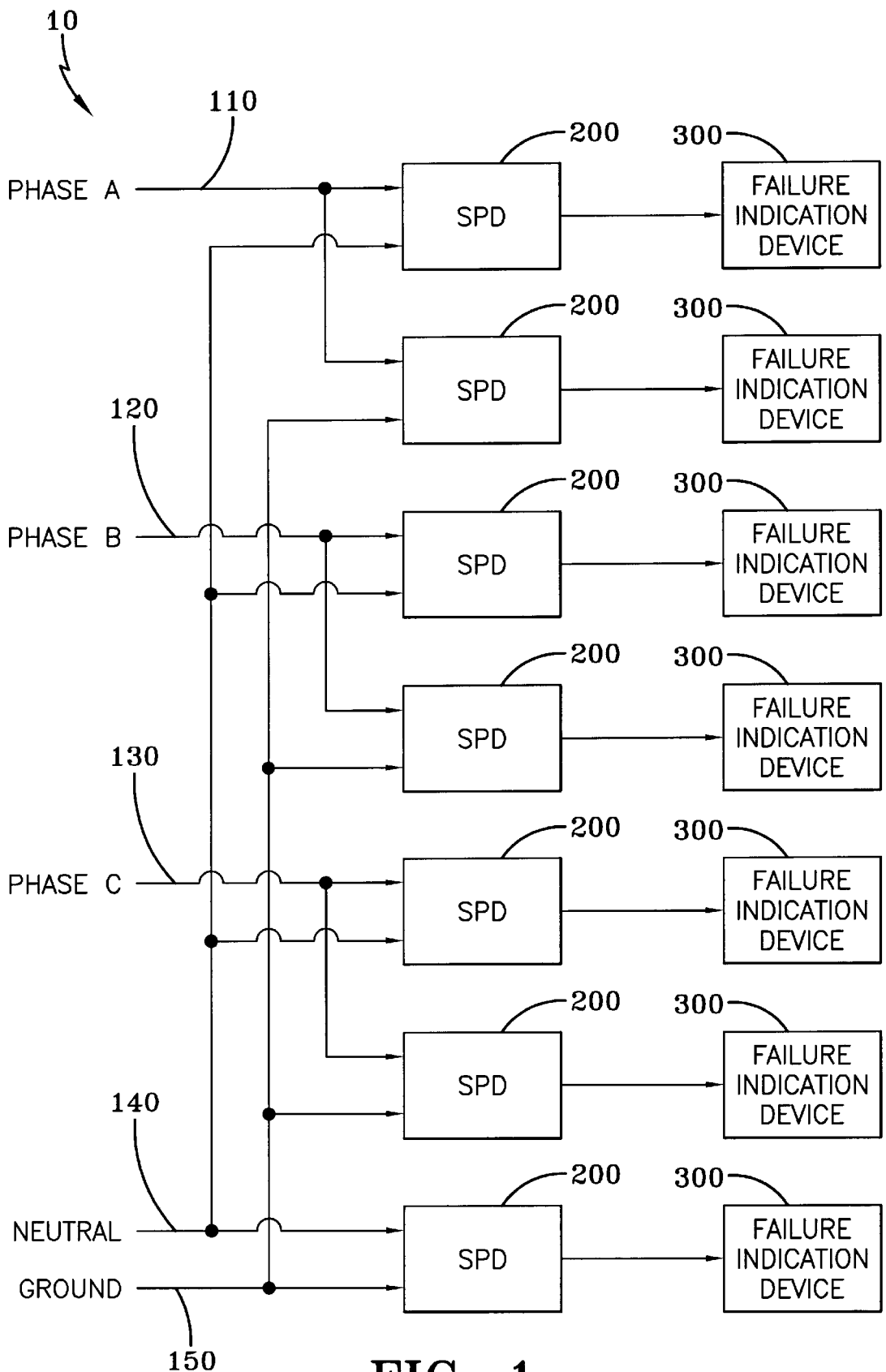
FIG. 1 shows a connection diagram of surge protection devices for a wye-configured power distribution network.

Turning now to FIG. 1, FIG. 1 shows a connection diagram of surge protection devices 10 for a wye-configured power distribution network. Seven surge protection devices 200 are required for a wye-configured power distribution network. A similar configuration of six surge protection devices would be required for a delta-configured power distribution network. A surge protection device 200 connects between each of three phases 110, 120, 130 and neutral 140, and between each of three phases 110, 120, 130 and ground 150, as shown. A surge protection device 200 also connects between neutral 140 and ground 150. A failure indication device 300 is associated with and connects to each surge protection device 200.

Figure 2:
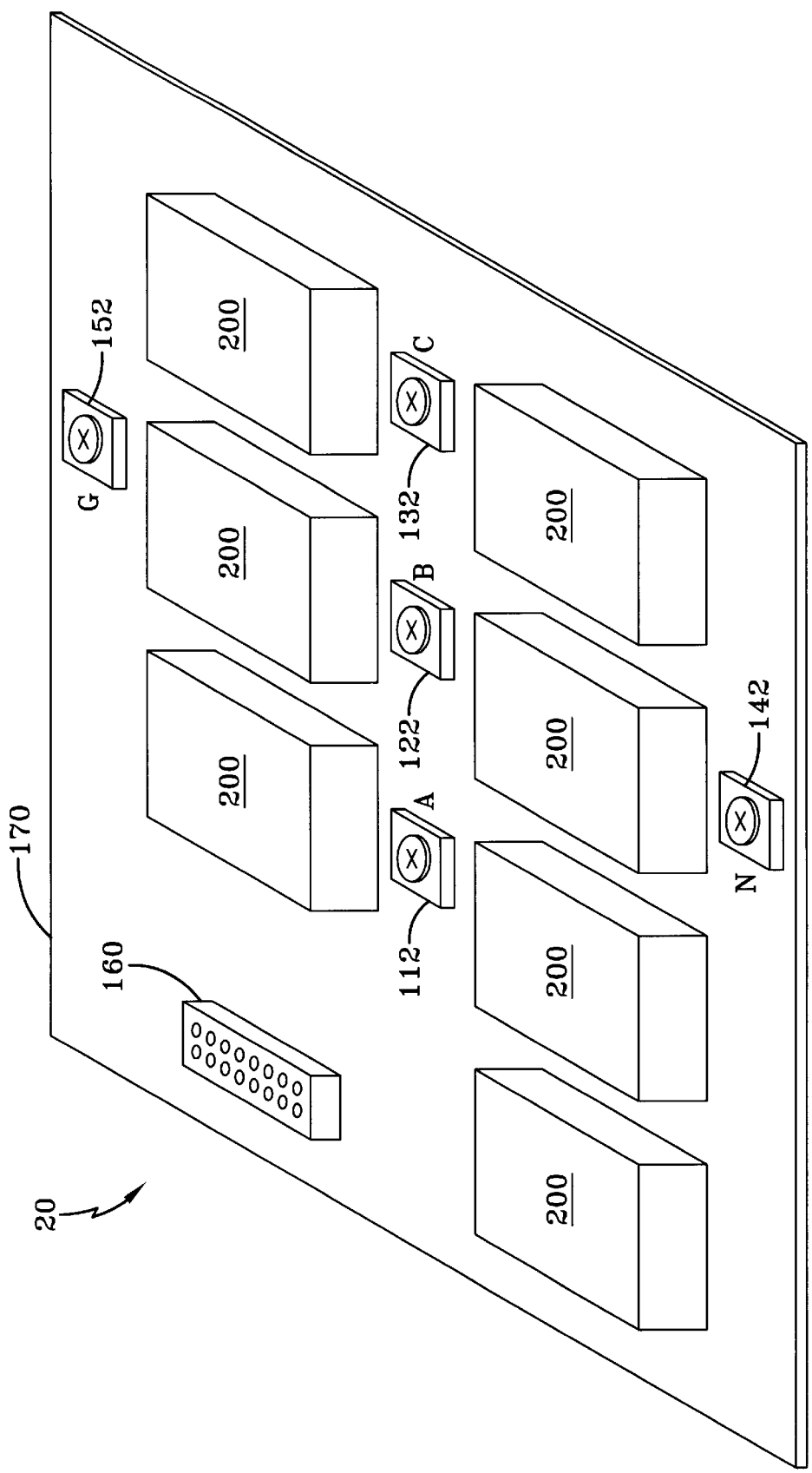
FIG. 2 shows a typical equipment configuration of the surge protection devices for a wye-configured power distribution network.

Turning now to FIG. 2, FIG. 2 shows a typical equipment configuration of the surge protection devices 20 for a wye-configured power distribution network. Seven surge protection devices 200 are mounted on a printed circuit board 170. Connectors are provided for phase A 112, phase B 122, phase C 132, neutral 142, and ground 152. Not shown are the failure indication devices that receive signals through the connector 160.

Figure 3A:
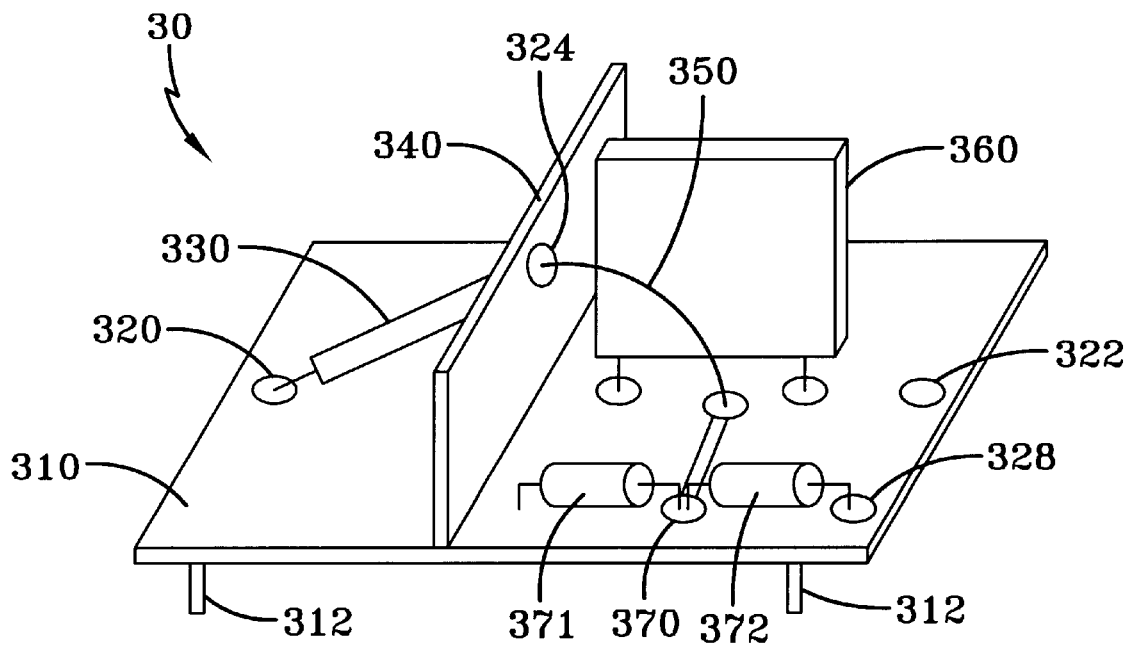
FIG. 3A shows a typical component configuration of a single-circuit surge protection device.
Figure 3B:
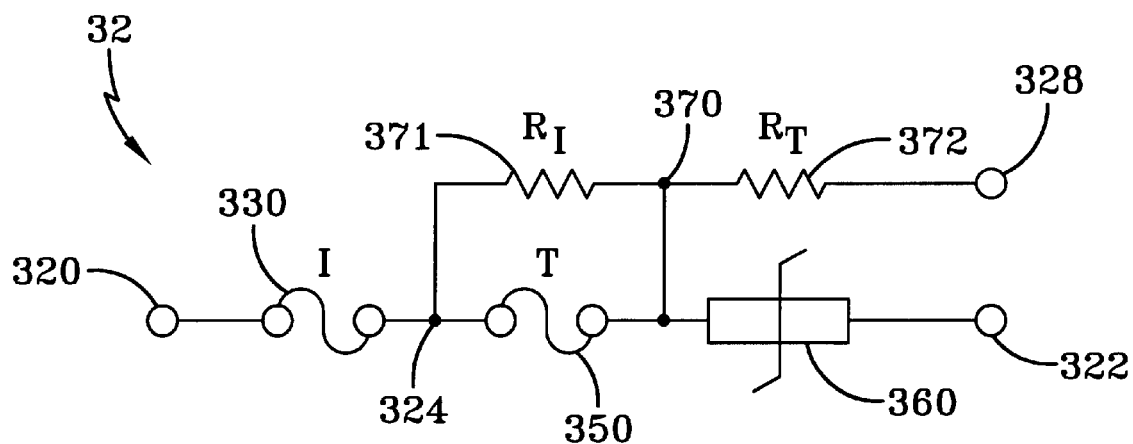
FIG. 3B shows a schematic diagram of a single-circuit surge protection device using sensing resistors.
Figure 3C:
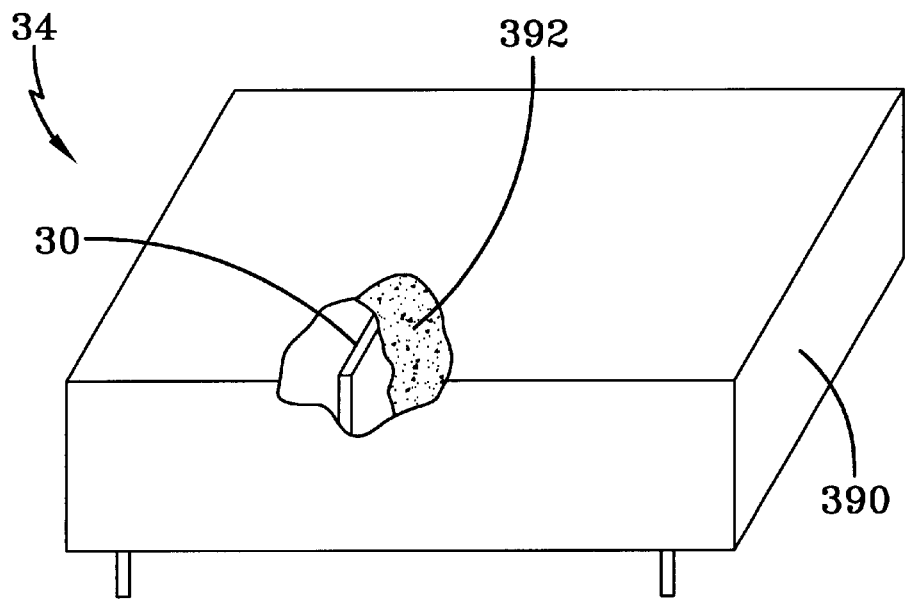
FIG. 3C shows an enclosed module of a single-circuit surge protection device.
Figure 3D:
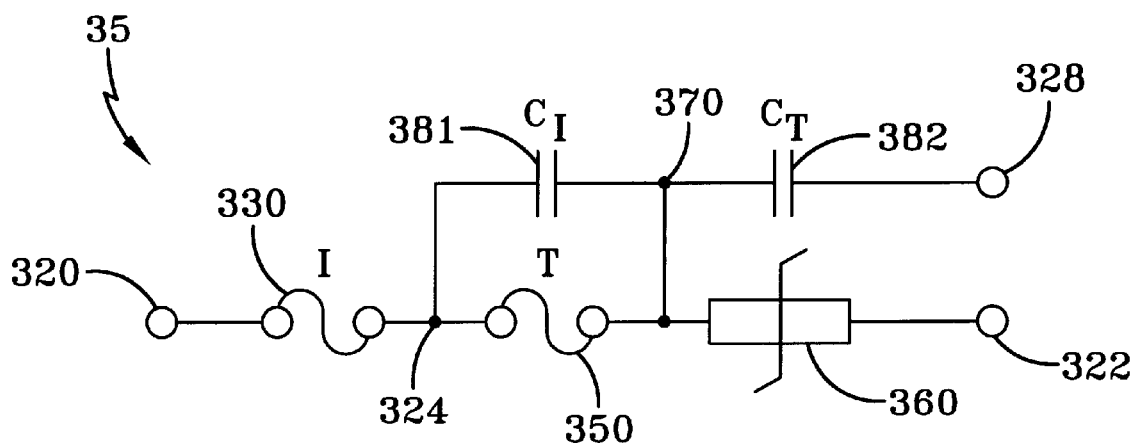
FIG. 3D shows a schematic diagram of a single-circuit surge protection device using sensing capacitors.

Turning now to FIG. 3, FIG. 3A shows a typical component configuration of a single-circuit surge protection device 30, FIG. 3B shows a schematic diagram 32 of a single-circuit surge protection device using sensing resistors, and FIG. 3D shows a schematic diagram 35 of a single-circuit surge protection device using sensing capacitors. The following description applies to FIGS. 3A, 3B, and 3D. The circuit components are mounted on a printed circuit board 310 having connector pins 312 positioned on a side opposite the components for connecting to another printed circuit board. A current limiter component 330 connects between a first input terminal 320 and a bridge terminal 324 located on an upper portion of a bridge 340. The current limiter component 330 limits the maximum current through a metal oxide varistor 360. The bridge 340 is positioned in a perpendicular relationship with the printed circuit board 310. The bridge 340 is positioned between the current limiter 330 and the metal oxide varistor 360 to provide an isolating barrier between the two components, and to provide a support means to extend the length of the current limiting component 330 for extinguishing any electrical arcing in the current limiting component 330. A thermal protector component 350 connects between the bridge terminal 324 and a central terminal 370. The thermal protector component 350 is positioned in close proximity to the metal oxide varistor 360 and open-circuits upon reaching a predetermined temperature in order to prevent disintegration of the metal oxide varistor 360 from excessive self-heating. A current sense resistor 371 also connects between the bridge terminal 324 and the central terminal 370. A current sense capacitor, 381 shown in FIG. 3D, could also be used in place of the current sense resistor 371 shown in FIG. 3B. The metal oxide varistor 360 connects between the central terminal 370 and a second input terminal 322. The metal oxide varistor 360 is typically between a 10-millimeter and an 80-millimeter device. A thermal sense resistor 372 connects between the central terminal 370 and an indicator terminal 328. A thermal sense capacitor, 382 shown in FIG. 3D, could also be used in place of the thermal sense resistor 372 shown in FIG. 3B. A failure-indicating device may be connected to the indicator terminal 328. The current sense resistor 371 or current sense capacitor 381 and the thermal sense resistor 372 or thermal sense capacitor 382 are configured to provide a distinguishing indication between a current limiter component 330 open-circuit and a thermal protector component 350 open-circuit. The current limiter component 330 may be a single strand of silver wire, multiple strands of silver wire, silver ribbon, perforated silver ribbon, copper ribbon, or perforated copper ribbon. A fuse tube may also enclose the current limiter component 330, as shown in FIG. 5B, in order to increase the current limiting capability of the current limiter component 330. The thermal protector component 350 is a low melting point alloy wire, such as lead-antimony alloy wire or lead-indium alloy wire. The thermal protector 350 may also be a commercially available thermal cutout device. A power distribution network connects to the first input terminal 320 and the second input terminal 322.

FIG. 3C shows an enclosed module 34 containing a single-circuit surge protection device 30. The structure 30 shown in FIG. 3A is positioned within a housing 390 and the housing 390 is filled with sand 392. Sand 392 is used to position the thermal protector component 350 and to thermally couple it to the metal oxide varistor 360. The sand 392 and the bridge 340 provide isolation between the current limiter component 330 and the other components, including the thermal protector component 350 and the metal oxide varistor 360. Sand 392 is also required to enable interruption by the current limiter component of high fault currents without dispersement of conductive plasma gasses.

Figure 4A:
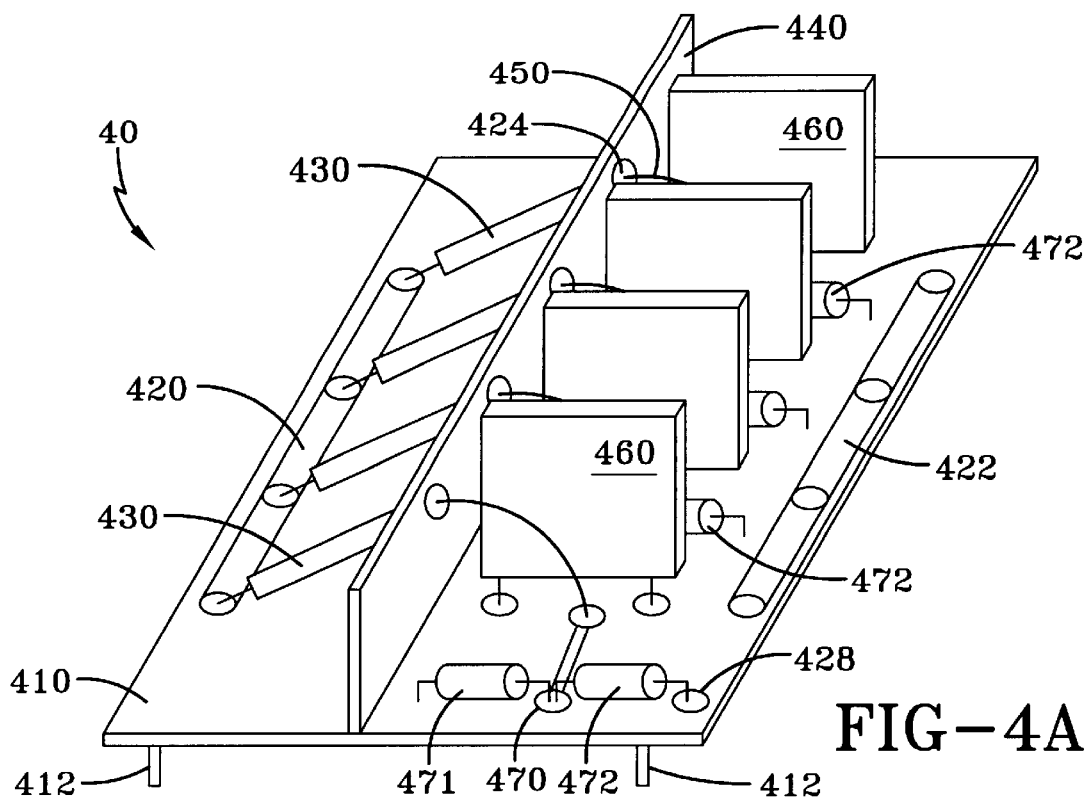
FIG. 4A shows a typical component configuration of a multiple-circuit surge protection device.
Figure 4B:
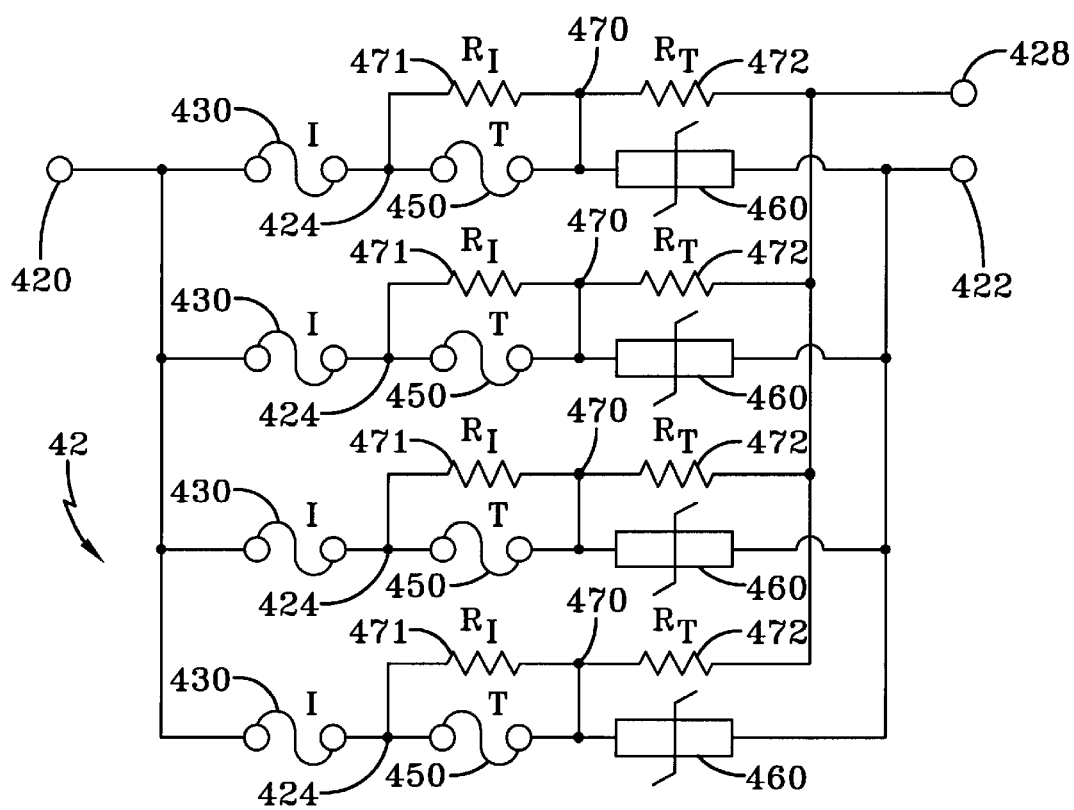
FIG. 4B shows a schematic diagram of a multiple-circuit surge protection device using sensing resistors.
Figure 4C:
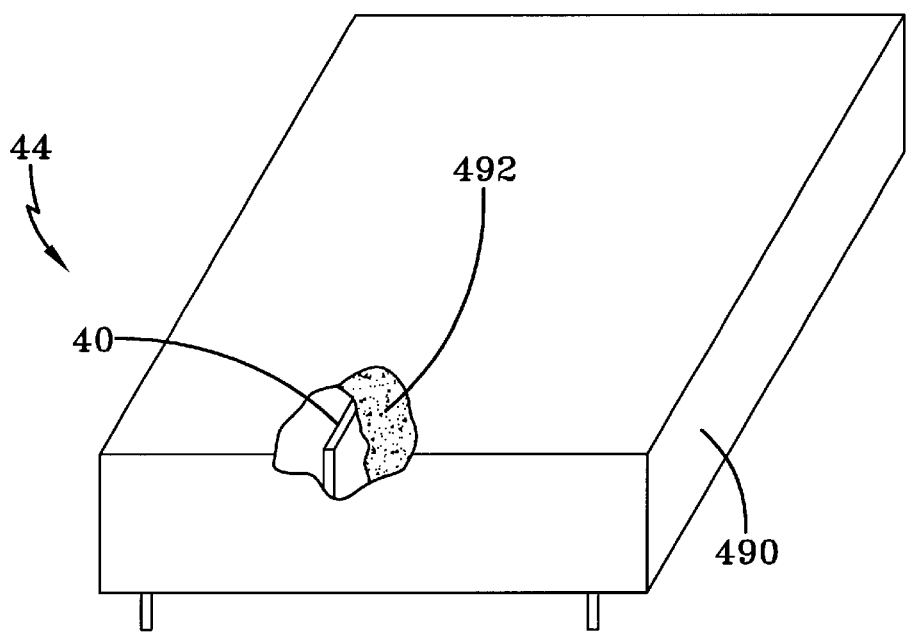
FIG. 4C shows an enclosed module of a multiple-circuit surge protection device.
Figure 4D:
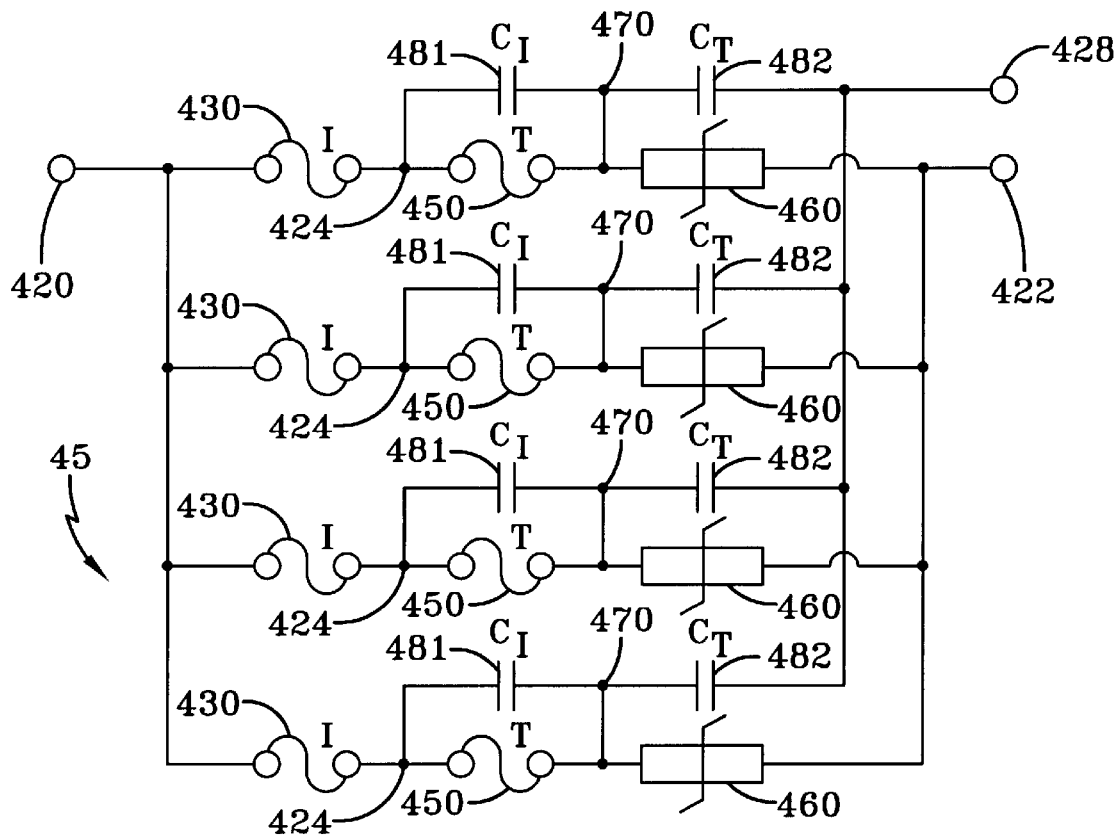
FIG. 4D shows a schematic diagram of a multiple-circuit surge protection device using sensing capacitors.

Turning now to FIG. 4, FIG. 4A shows a typical component configuration 40 of a multiple-circuit surge protection device, FIG. 4B shows a schematic diagram 42 of a multiple-circuit surge protection device using sensing resistors, and FIG. 4D shows a schematic diagram 45 of a multiple-circuit surge protection device using sensing capacitors. It is understood by those having ordinary skill in the relevant art that any number of surge protection circuits may be connected in a parallel configuration to achieve a predetermined current handling capability, the number not being limited to one as shown in FIG. 3 or four shown in FIG. 4. The following description applies to FIGS. 4A, 4B and 4D. The circuit components are mounted on a printed circuit board 410 having connector pins 412 positioned on a side opposite the components for connecting to another printed circuit board. Current limiter components 430 connect between a first input terminal 420 and bridge terminals 424 located on an upper portion of a bridge 440. The current limiter components 430 limit the maximum current through metal oxide varistors 460. The bridge 440 is positioned in a perpendicular relationship with the printed circuit board 410. The bridge 440 is positioned between the current limiters 430 and the metal oxide varistors 460 to provide an isolating barrier between the two sets of components, and to provide a support means to extend the length of the current limiting components 430 for extinguishing any electrical arcing in the current limiting components 430. Thermal protector components 450 connect between the bridge terminals 424 and central terminals 470. The thermal protector components 450 are positioned in close proximity to the metal oxide varistors 460, and open-circuit upon reaching a predetermined temperature in order to prevent disintegration of the associated metal oxide varistor 460 from excessive self-heating. Current sense resistors 471 also connect between the bridge terminals 424 and the central terminals 470. Current sense capacitors, 481 shown in FIG. 4D, could also be used in place of the current sense resistors 471 shown in FIG. 4B. The metal oxide varistors 460 connect between the central terminals 470 and a second input terminal 422. The metal oxide varistors 460 are typically between a 10-millimeter and an 80-millimeter device. Thermal sense resistors 472 connect between the central terminals 470 and an indicator terminal 428. Thermal sense capacitors, 482 shown in FIG. 4D, could also be used in place of the thermal sense resistors 472 shown in FIG. 4B. A failure-indicating device may be connected to the indicator terminal 428. The current sense resistors 471 or current sense capacitors 481 and the thermal sense resistors 472 or thermal sense capacitors 482 are configured to provide a distinguishing indication between current limiter components 430 open-circuit and thermal protector components 450 open-circuit. The current limiter components 430 may be a single strand of silver wire, multiple strands of silver wire, silver ribbon, perforated silver ribbon, copper ribbon, or perforated copper ribbon. A fuse tube may also enclose the current limiter component 430 as shown in FIG. 5B, in order to increase the current limiting capability of the current limiter component 430. The thermal protector components 450 are a low melting point alloy wires, such as lead-antimony alloy wire or lead-indium alloy wire. The thermal protector 450 may also be a commercially available thermal cutout device. A power distribution network connects to the first input terminal 420 and the second input terminal 422 of the surge protection device 40.

FIG. 4C shows an enclosed module 44 of a multiple-circuit surge protection device 40. The structure 40 shown in FIG. 4A is positioned within a housing 490 and the housing 490 is filled with sand 492. Sand 492 is used to position the thermal protector components 450 and to thermally couple these components to the metal oxide varistors 460. The sand 492 and the bridge 440 provide isolation between the current limiter component 430 and the other components, including the thermal protector devices 450 and the metal oxide varistors 460. Sand 492 is also required to enable interruption by the current limiter component 430 of high fault currents without dispersement of conductive plasma gasses.

Figure 5A:
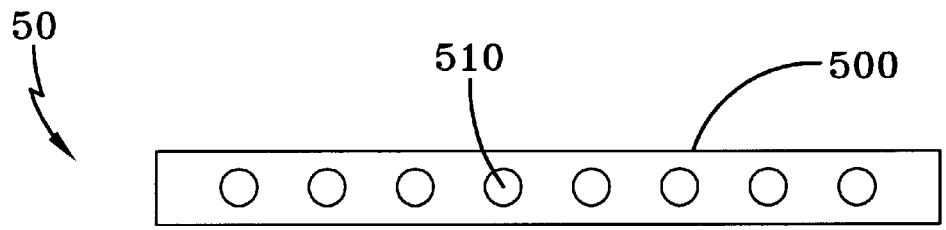
FIG. 5A shows a typical perforated ribbon configuration of a current limiter.
Figure 5B:
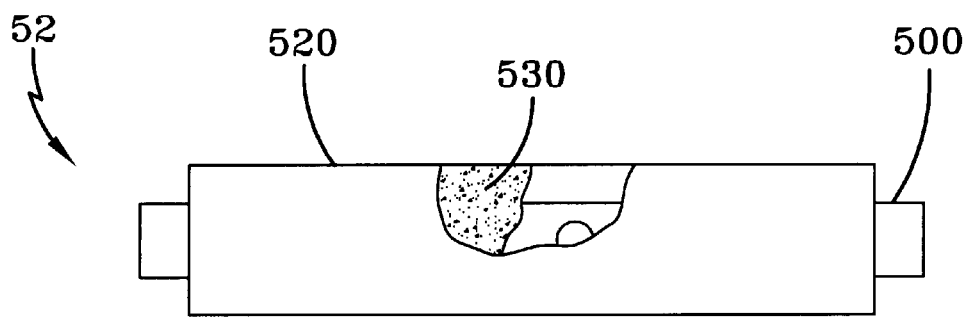
FIG. 5B shows a typical perforated ribbon configuration of a current limiter enclosed within a fuse tube.

Turning now to FIG. 5, FIG. 5A shows a typical perforated ribbon configuration of a current limiter 50, and FIG. 5B shows a typical perforated ribbon configuration of a current limiter enclosed within a fuse tube 52. The dimensions associated with the silver ribbon 500 may vary, depending upon the application. However for a typical application, the dimensions of the silver ribbon 500 may be 0.0075 inches thick and 0.150 inches wide, with 0.093-inch diameter holes 510 spaced on 0.250-inch centers. FIG. 5B shows the perforated ribbon 500 enclosed within a fuse tube 520. The fuse tube 520 is filled with sand 530. This configuration is capable of interrupting a current in excess of 200,000 amperes.

Figure 6B:
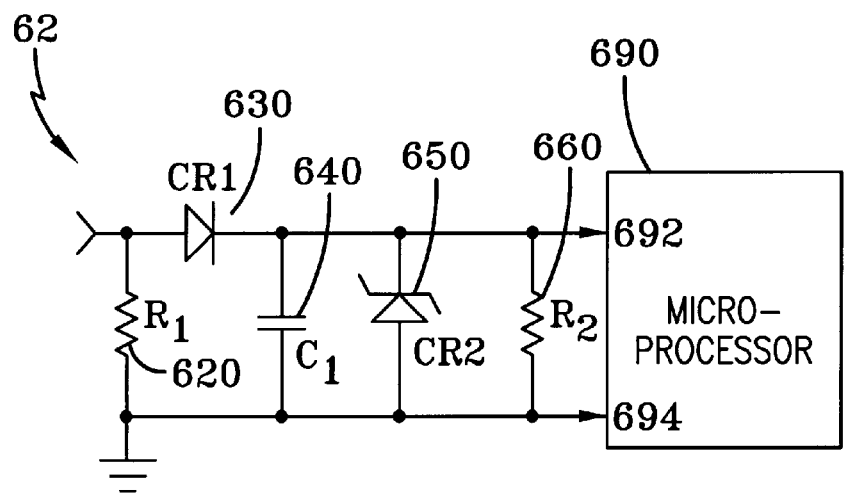
FIG. 6A shows a schematic diagram of a multiple-circuit surge protection device connected to circuitry and comparator for failure indication, and FIG. 6B show an alternative connection to a microprocessor.
Figure 6A:
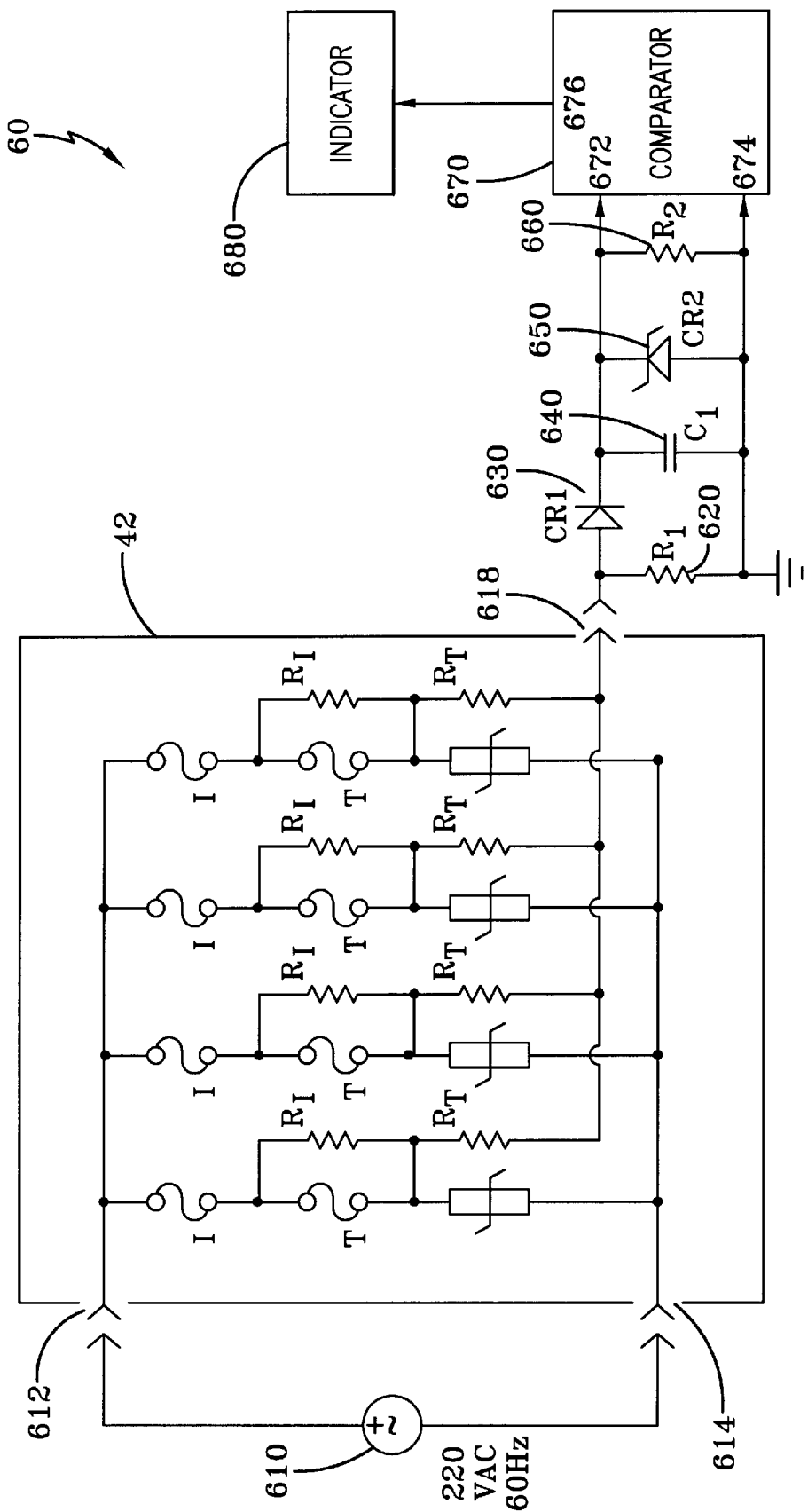

Turning now to FIG. 6, FIG. 6A shows a schematic diagram 60 of a multiple-circuit surge protection device connected to failure detection circuitry, a comparator, and a failure indicator. FIG. 6B show an alternative connection 62 comprising the failure detection circuitry and a microprocessor. The multiple-circuit surge protection device 42 is the same circuit previously described and shown in FIG. 4B. For brevity, the description of the circuit 42 is not repeated here. A single phase 610 of a power distribution network is shown connected to the input terminals 612, 614 of the surge protection device 42. The indicator terminal 616 of the surge protection device 42 is shown connected to a current summing resistor 620. A voltage developed across the current summing resister 620 is rectified by a diode 630, filtered by a capacitor 640 and resistor 660, and applied to the input terminals 672, 674 of a comparator 670. A zener diode 650 limits the maximum voltage excursion at the input terminals 672, 674 of the comparator 670 to a safe maximum operating level. If any of the current limiter components or the thermal protector components of the surge suppression device 42 open-circuit, the current through the summing resistor 620 will decrease, resulting in a decrease in the quiescent voltage at the input terminals 672, 674 of the comparator 670. The comparator 670 detects this change in voltage, indicative of a failure of a circuit component in the surge protection device 42, and activates an indicator 680 connected to an output 676 of the comparator 670. In this manner, multiple levels of failures may be detected in the surge protection device 42. FIG. 6B shows an alternate embodiment 62, comprising a microprocessor 690 having input terminals 692, 694 connected to the summing and filter circuit described above. The microprocessor is capable of converting the rectified input signal from the summing resistor 620 into a digital representation of the failure signal. In this manner, multiple levels of failures in the surge protection device 42 may be detected and distinguished by the microprocessor for notification to maintenance personnel.

Although the present invention has been described in considerable detail with reference to certain preferred embodiments thereof, other embodiments are possible. Therefore, the spirit and scope of the appended claims should not be limited to the description of the embodiments herein.

What is claimed is:

1. A surge protection device for a power distribution network, comprising:
  a) a current limiter connected between a first input terminal and a bridge terminal, the first input terminal connecting to the power distribution network;
  b) a thermal protector connected between the bridge terminal and a central terminal;
  c) a metal oxide varistor connected between the central terminal and a second input terminal, the second input terminal connecting to the power distribution network;
  d) a current sense resistor connected between the bridge terminal and the central terminal for distinguishing indication of current limiter open circuit;
  e) a thermal sense resistor connected between the central terminal and an indicator terminal for distinguishing indication of thermal protector open circuit; and
  f) a bridge positioned between the current limiter and the metal oxide varistor for providing an isolating barrier and the bridge terminal for connecting the current limiter and the thermal protector.

2. A surge protection device according to claim 1, wherein the current limiter comprises a perforated silver ribbon.

3. A surge protection device according to claim 1, wherein the current limiter comprises a perforated silver ribbon enclosed within a fuse tube.

4. A surge protection device according to claim 1, wherein the current limiter is selected from the group consisting of a strand of silver wire, multiple strands of silver wire, a silver ribbon, a copper ribbon, and a perforated copper ribbon.

5. A surge protection device according to claim 4, wherein the current limiter is enclosed in a fuse tube.

6. A surge protection device according to claim 1, wherein the thermal protector comprises a device selected from the group consisting of a low melting point alloy wire, a lead-indium alloy wire, a lead-antimony alloy wire, and a thermal cutout device.

7. A surge protection device according to claim 1, wherein the thermal protector is positioned in close proximity with the metal oxide varistor.

8. A surge protection device according to claim 1, wherein the current sense resistor is replaced by a current sense capacitor and the thermal sense resistor is replaced by a thermal sense capacitor.

9. A surge protection device according to claim 1, further comprising a housing for containing the surge protection device, sand for filling void spaces within the housing, and potting material for sealing the housing.

10. A surge protection device according to claim 1, further comprising a failure indicator circuit connected to the indicator terminal.

11. A surge protection device according to claim 1, wherein the configuration of the current sense resistor and the thermal sense resistor supplies a signal at the indicator terminal that provides a distinction between a thermal protector component open circuit and a current limiter component open circuit.

12. A surge protection device according to claim 10, wherein the failure indicator circuit comprises:
   a) a summing resistor connected between the indicator terminal and a ground;
   b) a rectifier having an anode connected to the indicator terminal and a cathode connected to a comparator circuit first input terminal;
   c) a capacitor and resistor parallel circuit connected between the rectifier cathode and the ground;
   d) a zener diode having a cathode connected to the rectifier anode and an anode connected to ground;
   e) a comparator circuit second input terminal connected to ground; and
   f) a comparator circuit output connected to a visual indicator.

13. A surge protection device according to claim 12, wherein the comparator is replaced by a microprocessor.

14. A surge protection device according to claim 1, wherein multiple surge protection devices are connected to a multi-phase power distribution system.

15. A surge protection device for a power distribution network, comprising:
   a) a plurality of identical circuits, each circuit comprising:
      i) a current limiter connected between a first input terminal and a bridge terminal;
      ii) a thermal protector connected between the bridge terminal and a central terminal;
      iii) a metal oxide varistor connected between the central terminal and a second input terminal;
      iv) a current sense resistor connected between the bridge terminal and the central terminal for distinguishing indication of current limiter open circuit;
      v) a thermal sense resistor connected between the central terminal and an indicator terminal for distinguishing indication of thermal protector open circuit; and
      vi) a bridge positioned between each current limiter and each metal oxide varistor for providing an isolating barrier and the bridge terminal for connecting the current limiter and the thermal protector;
   b) wherein the first input terminals of each identical circuit are connected together and connect to the power distribution network, the second input terminals of each identical circuit are connected together and connect to the power distribution network, and the indicators terminals are connected together.

16. A surge protection device according to claim 15, wherein each current limiter comprises a perforated silver ribbon.

17. A surge protection device according to claim 15, wherein each current limiter comprises a perforated silver ribbon enclosed within a fuse tube.

18. A surge protection device according to claim 15, wherein each current limiter is selected from the group consisting of a strand of silver wire, multiple strands of silver wire, a silver ribbon, a copper ribbon, and a perforated copper ribbon.

19. A surge protection device according to claim 15, wherein each current limiter is enclosed in a fuse tube.

20. A surge protection device according to claim 15, wherein each thermal protector comprises a device selected from the group consisting of a low melting point alloy wire, a lead-indium alloy wire, a lead-antimony alloy wire, and a thermal cutout device.

21. A surge protection device according to claim 15, wherein each thermal protector is positioned in close proximity with the metal oxide varistor in the same circuit.

22. A surge protection device according to claim 15, wherein each current sense resistor is replaced by a current sense capacitor and each thermal sense resistor is replaced by a thermal sense capacitor.

23. A surge protection device according to claim 15, further comprising a housing for containing the surge protection device, sand for filling void space within the housing and potting material for sealing the housing.

24. A surge protection device according to claim 15, further comprising a failure indicator circuit connected to the indicator terminal.

25. A surge protection device according to claim 15, wherein the configuration of the current sense resistors and the thermal sense resistors supply a signal at the indicator terminal that provides a distinction between thermal protector component open circuits and current limiter component open circuits.

26. A surge protection device according to claim 24, wherein the failure indicator circuit comprises a failure detection circuit, a comparator, and a visual indicator.

27. A surge protection device according to claim 26, wherein the comparator is replaced by a microprocessor.

28. A surge protection device according to claim 15, wherein multiple surge protection devices are connected to a multi-phase power distribution system.

29. A method of fabricating a surge protection device for a power distribution network, comprising:
   a) connecting a current limiter between a first input terminal and a bridge terminal, the first input terminal being connected to the power distribution network;
   b) connecting a thermal protector between the bridge terminal and a central terminal;
   c) connecting a metal oxide varistor between the central terminal and a second input terminal, the second input terminal being connected to the power distribution network;
   d) connecting a current sense resistor between the bridge terminal and the central terminal for distinguishing indication of current limiter open circuit;
   e) connecting a thermal sense resistor between the central terminal and an indicator terminal for distinguishing indication of thermal protector open circuit; and
   f) positioning a bridge between the current limiter and the metal oxide varistor for providing an isolating barrier and the bridge terminal for connecting the current limiter and the thermal protector.

30. A method of fabricating a surge protection device according to claim 29, wherein the current limiter comprises a perforated silver ribbon enclosed within a fuse tube.

31. A method of fabricating a surge protection device according to claim 29, wherein the thermal protector is positioned in close proximity with the metal oxide varistor.

32. A method of fabricating a surge protection device according to claim 29, further comprising:
 a) positioning the connected circuit components within a housing;
 b) filling the housing with sand; and
 c) sealing the housing with potting material.

33. A method of fabricating a surge protection device according to claim 29, further comprising connecting a failure indicator circuit to the indicator terminal.

34. A method of fabricating a surge protection device according to claim 29, wherein the current sense resistor is replaced by a current sense capacitor and the thermal sense resistor is replaced by a thermal sense capacitor.

* * * * *